(12) United States Patent
Tsai et al.

(10) Patent No.: US 6,512,286 B1
(45) Date of Patent: Jan. 28, 2003

(54) SEMICONDUCTOR PACKAGE WITH NO VOID IN ENCAPSULANT AND METHOD FOR FABRICATING THE SAME

(75) Inventors: Water Tsai, Taichung (TW); Yuan-Fu Lin, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/973,348

(22) Filed: Oct. 9, 2001

(51) Int. Cl.[7] ............................................. H01L 23/495
(52) U.S. Cl. ...................... 257/666; 257/676; 257/787; 438/123
(58) Field of Search ................................. 257/666, 676, 257/672, 678, 690, 787, 788, 792; 438/112, 123, 124, 125, 126, 127

(56) References Cited

U.S. PATENT DOCUMENTS

| 4,942,452 | A | | 7/1990 | Kitano et al. ................ 357/68 |
|---|---|---|---|---|
| 5,150,193 | A | | 9/1992 | Yasuhara et al. ............. 357/70 |
| 5,233,222 | A | | 8/1993 | Djennas et al. ............. 257/676 |
| 6,057,595 | A | * | 5/2000 | Pohl et al. ................... 257/666 |
| 6,087,715 | A | * | 7/2000 | Sawada et al. ............. 257/666 |
| 6,144,107 | A | * | 11/2000 | Narita ........................ 257/100 |
| 6,410,979 | B2 | * | 6/2002 | Abe ........................... 257/666 |
| 6,440,779 | B1 | * | 8/2002 | Chiu et al. .................. 438/123 |

* cited by examiner

Primary Examiner—Olik Chaudhuri
Assistant Examiner—Hoai Pham
(74) Attorney, Agent, or Firm—Peter F. Corless; Steven M. Jensen; Edwards & Angell, LLP

(57) ABSTRACT

A semiconductor package and a method for fabricating the same are proposed, in which a chip is attached to a die pad formed with an opening in a manner that the chip covers the opening and a surface of the chip is partially exposed to the opening. A covering layer is formed on the exposed surface of the chip, so as to fill a gap formed between the chip and the die pad in proximity to the opening, and allow air in the gap to be dissipated. This makes an encapsulant formed for encapsulating the chip and the die pad with no void formed therein, so that no die crack or popcorn effect occurs in the fabricated product, and thus quality and reliability of the semiconductor package can be assured.

11 Claims, 3 Drawing Sheets

SEMICONDUCTOR PACKAGE WITH NO VOID IN ENCAPSULANT AND METHOD FOR FABRICATING THE SAME

FIELD OF THE INVENTION

The present invention relates to semiconductor packages and methods for fabricating the same, and more particularly, to a semiconductor package, in which a die pad of a lead frame acts as a chip carrier with an opening formed in the die pad, and a method for fabricating the semiconductor package.

BACKGROUND OF INVENTION

A semiconductor package with a lead frame acting as a chip carrier generally has the following drawbacks. First, a die pad of the lead frame is dimensionally large in surface area. Moreover, the die pad is in poor adherence with an encapsulant encapsulating a chip disposed on the die pad. This tends to cause delamination between the die pad and the encapsulant during temperature variation in a reliability test or practical operation, and therefore deteriorates reliability and quality of he semiconductor package. Further, as the chip is attached in larger area to the die pad, thus the chip suffers greater thermal stress generated from the die pad during a temperature cycle in a fabrication process. This easily makes the chip crack or delaminated from the die pad.

In order to eliminate the foregoing drawbacks, U.S. Pat. No. 5,233,222 proposes a semiconductor package with a die pad having an opening, as shown in FIG. 3A. The semiconductor package 3 has a die pad 30 formed with an opening 300 therein. A chip 31 is attached to the die pad 30 via silver paste 32 in a manner that, the chip 31 covers the opening 300, and a bottom side 310 of the chip 31 is partially exposed to outside of the opening 300. This significantly decreases the attachment area between the chip 31 and the die pad 30, and thus effectively reduces thermal stress generated by the die pad 30 to the chip 31, so that delamination between the die pad 30 and the chip 31 and cracking of the chip 31 can be prevented. Moreover, in the provision of the opening 300, adherence between the die pad 30 and an encapsulant 33 encapsulating the chip 31 can be further improved. Similarly, U.S. Pat. No. 5,327,008 also proposes a semiconductor package with a die pad of a X-like shape, in an effort to reduce attachment area between a chip and a die pad. As improvements rendered by this latter patent are similar to those depicted in the above former patent, thus the latter patent is not illustrated with reference to a drawing.

As described above, the foregoing two U.S. patents have several drawbacks; however, the silver paste for attaching the chip to the die pad needs to be applied in a precisely controlled amount. As shown in FIG. 3B, if the silver paste 32 is used in excess, excess silver paste 32 leaks downwardly through a periphery of the opening 300 of the die pad 30, and thus contaminates the semiconductor package. Further, as the silver paste 32 has a high coefficient of thermal expansion (CTE) of about 80 ppm, thus delamination occurs between the encapsulant 33 and the silver paste 32 due to CTE dismatch. As shown in FIG. 3C, if the silver paste 32 is used in an insufficient amount, a gap 301 is easily formed between the chip 31 and the die pad 30 at the periphery of the opening 300. In a molding process for forming the encapsulant 33, a molding resin can not completely fill up the gap 301, and thus voids are formed, thereby making the chip 31 easily crack at positions corresponding to the voids. As a result, the delamination or void formation detrimentally affects reliability and quality of the semiconductor package. However, precisely controlling the usage amount of the silver paste increases costs and complexity in fabrication, and is substantially difficult to perfectly implement.

Therefore, in order to solve the foregoing problems, U.S. Pat. Nos. 4,942,452 and 5,150,193 each proposes a semiconductor package with a die pad formed with a groove thereon. As shown in FIG. 4, the semiconductor package 4 has a die pad 40 formed with a groove 401 in proximity to an opening 400. The groove 401 is used to prevent silver paste 42 applied in excess on the die pad 40 from flashing to the opening 400. However, if the silver paste 42 is used in an insufficient amount, a gap 402 between a chip 41 and the die pad 40 can not be completed filled with the silver paste 42, thereby making voids formed in the gap 402. As a result, the problem of forming voids still exists.

SUMMARY OF THE INVENTION

A primary objective of the present invention is to provide a semiconductor package and a method for fabricating the same, so as to effectively prevent void formation and flash of silver paste from occurrence.

In accordance with the foregoing and other objectives, the present invention proposes a semiconductor package and a method for fabricating the same. The semiconductor package of the invention comprises: a lead frame having a die pad and a plurality of leads, wherein the die pad is formed with at least one opening therein; a chip attached to the die pad via an adhesive in a manner that, the chip covers on end of the opening and a surface of the chip is partially exposed to the opening, wherein a gap connected to the opening is formed between the chip and the die pad in proximity to the opening; a covering layer formed on the exposed surface of the chip for completely filling the gap, so as to allow air in the gap to be completely dissipated; a plurality of conductive elements for electrically connecting the chip to the leads; and an encapsulant for encapsulating the chip, the die pad, the covering layer, the conductive elements and part of the leads.

The method for fabricating a semiconductor package comprises the steps of: providing a lead frame having a die pad and a plurality of leads, wherein the die pad is formed with at least one opening therein; attaching a chip to the die pad via an adhesive in a manner that, the chip covers on end of the opening and a surface of the chip is partially exposed to the opening, wherein a gap connected to the opening is formed between the chip and the die pad in proximity to the opening; forming a covering layer on the exposed surface of the chip for completely filling the gap, so as to allow air in the gap to be completely dissipated; bonding a plurality of conductive elements between the chip and the leads, so as to electrically connect the chip to the leads; and forming an encapsulant for encapsulating the chip, the die pad, the covering layer, the conductive elements and part of the leads.

The opening in the die pad is not particularly restricted in size and shape, but needs to reduce attachment area between the chip and the die pad and provide sufficient support to the chip.

The gap between the chip and the die pad is formed by applying the adhesive on the die pad for attaching the chip to the die pad in an amount that does not cover area on the die pad in proximity to the opening.

The covering layer can be made of a resin compound good in fluidity such as polyimide resin, and completely fills the gap between the chip and the die pad with air in the gap being completely dissipated, so that no void is formed in the encapsulant after completing a molding process for forming the encapsulant.

BRIEF DESCRIPTION OF THE DRAWINGS

The present invention can be more fully understood by reading the following detailed description of the preferred embodiments, with reference made to the accompanying drawings wherein.

DETAILED DESCRIPTION OF THE PREFERRED EMBODIMENT

Figure 1:
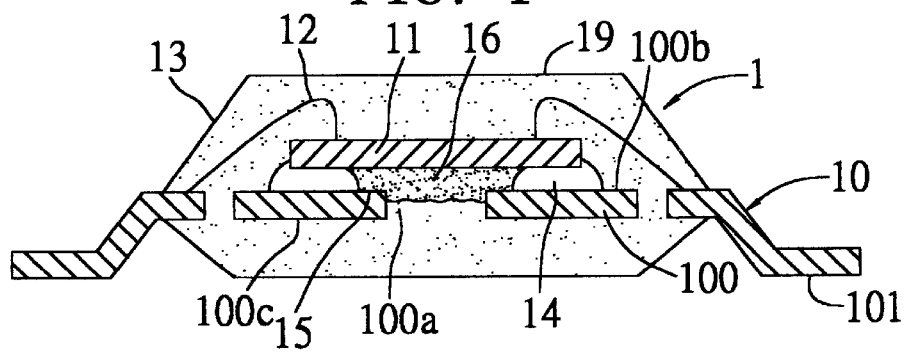
FIG. 1 is a sectional view of a semiconductor package of the invention.

As shown in FIG. 1, a semiconductor package 1 of the invention comprises a lead frame 10, a chip 11 disposed on the lead frame 10, a plurality of bonding wires 12 for electrically connecting the chip 11 to the lead frame 10, and an encapsulant 13 for encapsulating the chip 11, the bonding wires 12 and part of the lead frame 10.

The lead frame 10 has a die pad 100 and a plurality of leads 101 disposed around the die pad 100. An opening 100a is formed in the die pad 100, and penetrates from a top side 100b to a bottom side 100c of the die pad 100. Moreover, the die pad 100 can be formed with an even number of openings, with no particular restriction on the opening shape. Necessarily, after the chip 11 is attached to the top side 100b of the die pad 100 via a conventional adhesive 14 such as silver paste, the chip 11 needs to completely cover an end of the opening 100a on the top side 100b of the die pad 100 in a manner that, a portion of a bottom side 110 of the chip 11 corresponding in position to the opening 100a is exposed to the opening 100a.

The adhesive 14 for attaching the chip 11 to the die pad 100 is not applied at area on the top side 100b of the die pad 100 in proximity to the opening 100a. Therefore, after the chip 11 is attached to the die pad 100, a gap 15 is formed at the area with no adhesive applied thereon, and prevents the adhesive 14 from leaking downwardly from a periphery of the opening 100a in a die bonding process, so as not to contaminate the fabrication equipment and semi-fabricated product. Further, as the adhesive 14 does not flash on inner walls of the opening 100a, thus delamination depicted in a conventional semiconductor package can be prevented from occurring at the inner walls.

A covering layer 16 made of polyimide resin or the like is formed on the exposed portion of the bottom side 110 of the chip 11. The covering layer 16 is used to completely fill the gap 15 in a manner as to dissipate out air in the gap 15. Therefore, after the encapsulant 13 is formed into shape, no void is formed in the gap 15, and thus a problem of generating a popcorn effect can be avoided. The covering layer 16 only needs to have sufficient fluidity for completely filling the gap 15, with no particular restriction on its thickness.

Figure 2A:
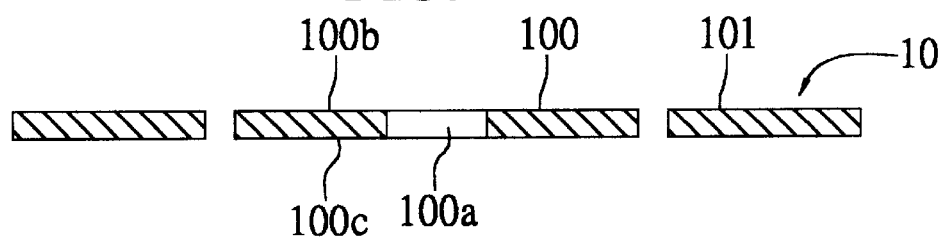
FIGS. 2A–2G are schematic diagrams depicting a method for fabricating a semiconductor package of the invention.

A method for fabricating the semiconductor package 1 is described with reference to FIGS. 2A–2G. Referring first to FIG. 2A, a lead frame 10 having a die pad 100 and a plurality of leads 101 is provided. An opening 100a is formed in the die pad 100, and penetrates from a top side 100b to a bottom side 100c of the die pad 100. Since the lead frame 10 is identical to that used in the prior art, it is not further described herein.

Figure 2B:
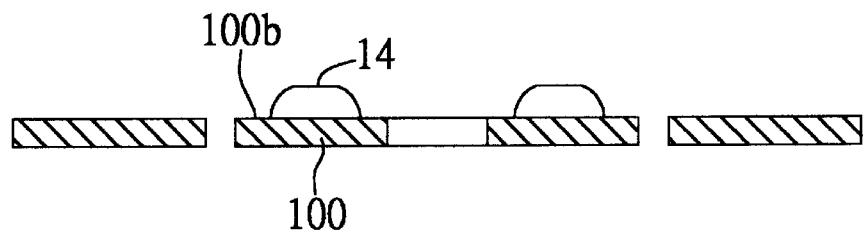

Referring to FIG. 2B, an adhesive 14 such as silver paste is applied in an appropriate amount by using a conventional means on the top side 100b of the die pad 100 excluding area in proximity to a periphery of the opening 100a.

Figure 2C:
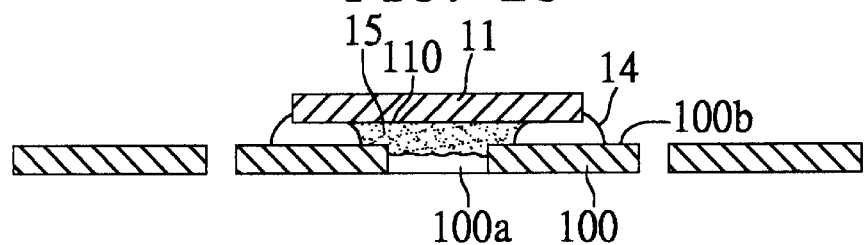

Referring to FIG. 2C, a chip 11 is placed on the top side 100b of the die pad 100, and attached to the die pad 100 via the adhesive 14 in a manner that, the chip 11 covers an end of the opening 100a on the top side 100b of the die pad 100, and a portion of a bottom side 110 of the chip 11 is exposed to the opening 100a. As the area on the top side 100b of the die pad 100 in proximity to the periphery of the opening 100a is not applied with the adhesive 14 thereon, after the chip 11 is attached to the die pad 100, a gap 15 is formed at the area with no adhesive applied thereon between the chip 11 and the die pad 100, so as to prevent the adhesive 14 from flashing to the opening 100a in a die bonding process for bonding the chip 11, and allow the fabrication equipment or semi-fabricated product to be free of contamination by the adhesive 14 after completing the die bonding process.

Figure 2D:
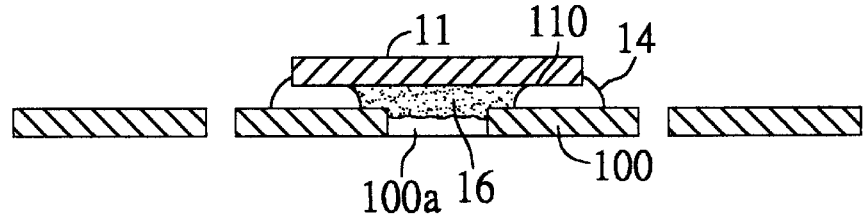

Referring to FIG. 2D, after completing the die bonding process, a polyimide resin with good fluidity is applied on the exposed portion of the bottom side 110 of the chip 11 through the opening 100a by using a conventional dispersing means, so as to form a covering layer 16 completely filling the gap 15 and covering the exposed portion of the bottom side 110. The covering layer 16 allows air in the gap 15 to be completely dissipated out with no void formed therein.

Figure 2E:
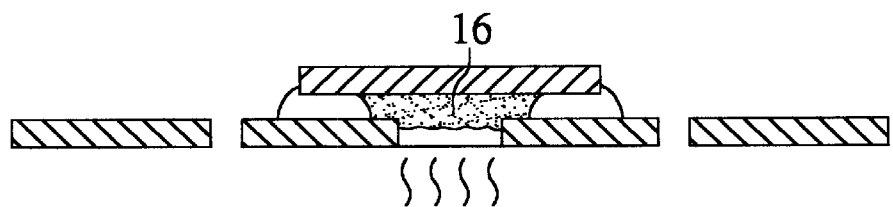

Referring to FIG. 2E, after the covering layer 16 is formed, a curing process is performed to stabilize and solidify the covering layer 16. Since the curing process is conventional, it is not further described herein.

Figure 2F:
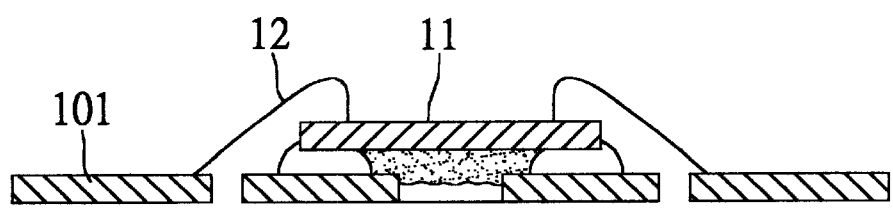

Referring to FIG. 2F, a wire bonding process is performed for the lead frame 10 disposed with the chip 11 thereon in a manner that, a plurality of gold wires 12 are used to electrically connect the chip 11 to the corresponding leads 101. Since the wire bonding process is conventional, it is not further described herein.

Figure 2G:
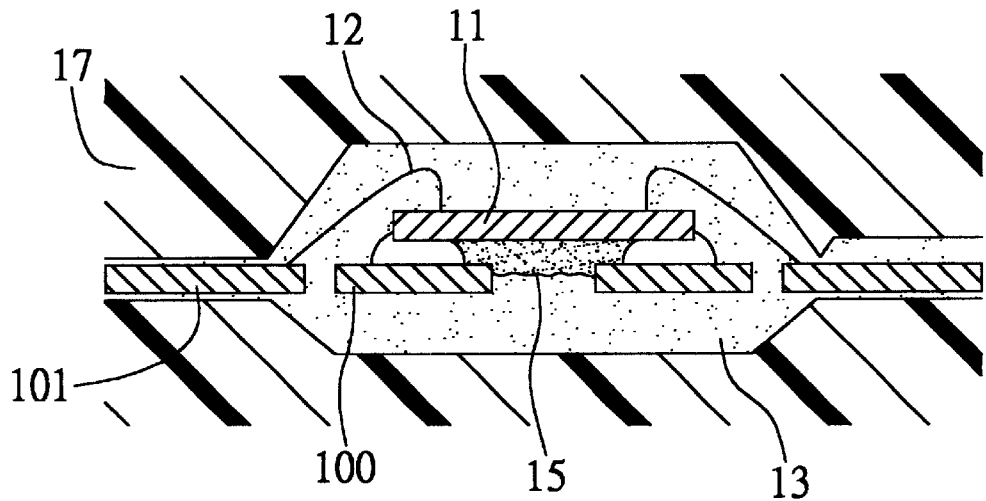
Figure 3A:
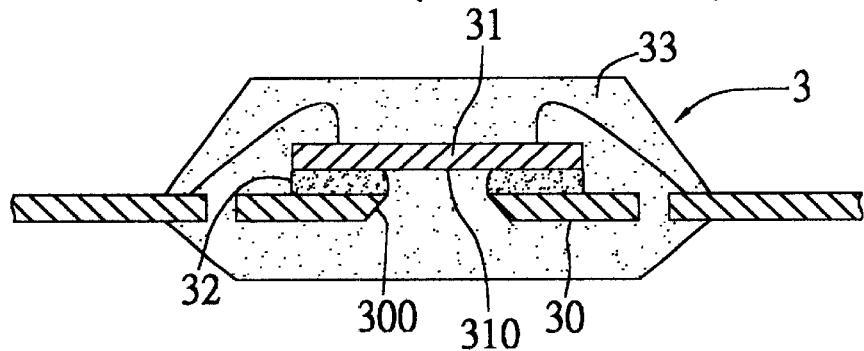
FIG. 3A (PRIOR ART) is a sectional view of a conventional semiconductor package.
Figure 3B:
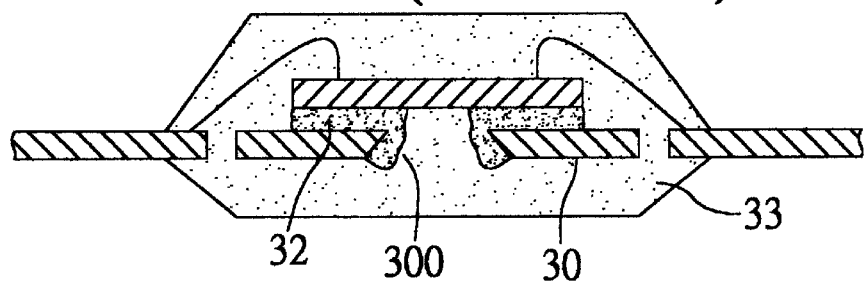
FIG. 3B (PRIOR ART) is a schematic diagram depicting flash of silver paste to an opening in the semiconductor package of FIG. 3A.
Figure 3C:
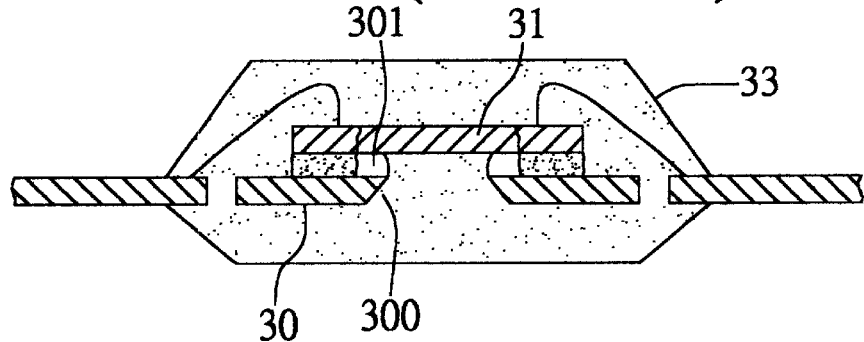
FIG. 3C (PRIOR ART) is a schematic diagram depicting a gap formed between a chip and a die pad in the semiconductor package of FIG. 3A.
Figure 4:
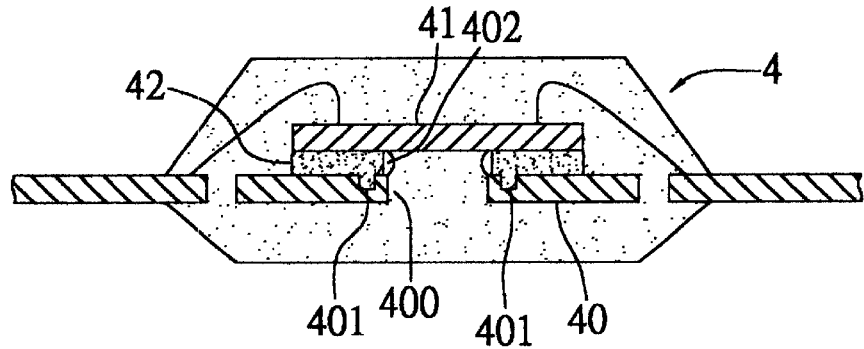
FIG. 4 (PRIOR ART) is a sectional view of another conventional semiconductor package.

Referring finally to FIG. 2G, after completing the wire bonding process, in a molding process, the semi-fabricated product is placed into a mold 17, so as to form an encapsulant 13 for encapsulating the chip 11, the die pad 100 and the gold wires 12. The leads 101 each is partially encapsulated by the encapsulant 13, and partially exposed to outside of the encapsulant 13, wherein the exposed part of each of the leads 101 can be connected to an external device such as a printed circuit board. Since the molding process is conventional, it is not further described herein.

After the encapsulant 13 is formed into shape, a curing process is performed to solidify the encapsulant 13, and thus it completes the fabrication of the semiconductor package 1 shown in FIG. 1. Since subsequent processes such as trimming, marking and forming are conventional, they are not further described herein.

In conclusion, in the provision of the covering layer 16, air in the gap between the chip 11 and the die pad 100 is completely dissipated out, so that no void is formed in the encapsulant 13, and no popcorn effect is generated in the semiconductor package 1 of the invention. Moreover, as the adhesive 14 for attaching the chip 11 to the die pad 100 does not flash to the opening 100*a* of the die pad 100, thus no delamination occurs between the die pad 100 and the encapsulant 13. This therefore improves quality and reliability of the semiconductor package 1 of the invention.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
    a lead frame having a die pad and a plurality of leads, wherein the die pad is formed with at least one opening therein;
    a chip attached to the die pad via an adhesive in a manner that, the chip covers an end of the opening and a surface of the chip is partially exposed to the opening, wherein a gap connected to the opening is formed between the chip and the die pad in proximity to the opening;
    a covering layer formed on the exposed surface of the chip for completely filling the gap, so as to allow air in the gap to be completely dissipated;
    a plurality of conductive elements for electrically connecting the chip to the leads; and
    an encapsulant for encapsulating the chip, the die pad, the covering layer, the conductive elements and part of the leads.

2. The semiconductor package of claim 1, wherein the covering layer is made of a resin material of desired fluidity.

3. The semiconductor package of claim 2, wherein the resin material is polyimide resin.

4. The semiconductor package of claim 1, wherein the conductive elements are bonding wires.

5. The semiconductor package of claim 4, wherein the bonding wires are gold wires.

6. A method for fabricating a semiconductor package, comprising the steps of
    providing a lead frame having a die pad and a plurality of leads, wherein the die pad is formed with at least one opening therein;
    attaching a chip to the die pad via an adhesive in a manner that, the chip covers an end of the opening and a surface of the chip is partially exposed to the opening, wherein a gap connected to the opening is formed between the chip and the die pad in proximity to the opening;
    forming a covering layer on the exposed surface of the chip for completely filling the gap, so as to allow air in the gap to be completely dissipated;
    bonding a plurality of conductive elements between the chip and the leads, so as to electrically connect the chip to the leads; and
    forming an encapsulant for encapsulating the chip, the die pad, the covering layer, the conductive elements and part of the leads.

7. The method of claim 6, wherein the covering layer is made of a resin material good in fluidity.

8. The method of claim 7, wherein the resin material is polyimide resin.

9. The method of claim 6, wherein the conductive elements are bonding wires.

10. The method of claim 9, wherein the bonding wires are gold wires.

11. The method of claim 6, further comprising a step of performing a curing process for solidifying the covering layer after the covering layer is formed.

* * * * *